(12) United States Patent
Takashima (10) Patent No.: US 6,406,600 B1
(45) Date of Patent: Jun. 18, 2002

(54) COPT-BASE SPUTTERING TARGET, METHOD OF MAKING SAME, MAGNETIC RECORDING FILM AND CO-PT-BASE MAGNETIC RECORDING MEDIUM

(75) Inventor: Hiroshi Takashima, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 09/395,348

(22) Filed: Sep. 14, 1999

(30) Foreign Application Priority Data

Mar. 29, 1999 (JP) ............................................ 11-085414

(51) Int. Cl.$^7$ ......................... C23C 14/14; C25C 11/04; H01F 1/04; C22C 19/07; C22C 5/04
(52) U.S. Cl. ........................... 204/298.13; 204/298.12; 148/313; 148/425; 75/246
(58) Field of Search ............................ 428/694 T, 900, 428/65.3, 65.7; 204/192.15, 192.2, 298.12, 298.13; 148/313, 425, 674, 678; 419/49; 75/246

(56) References Cited

U.S. PATENT DOCUMENTS 5,789,088 A * 8/1998 Nakai et al. ................. 428/611
5,875,083 A * 2/1999 Oniki et al. ................. 360/135

FOREIGN PATENT DOCUMENTS

| JP | 2-49384 | 10/1990 |
| JP | 4-297572 | 10/1992 |
| JP | 04297572 A | * 10/1992 |
| JP | 05148631 A | * 6/1993 |
| JP | 8-25270 | 1/1996 |

* cited by examiner

*Primary Examiner*—Paul Thibodeau
*Assistant Examiner*—Holly C. Rickman
(74) *Attorney, Agent, or Firm*—Sughrue Mion, PLLC (57) ABSTRACT

Provided are a CoPt-base sputtering target which can produce a magnetic recording medium having a recording layer with uniform film characteristics and excellent recording and reproducing characteristics, a method of making this sputtering target, a magnetic recording film, and a CoPt-base magnetic recording medium. The CoPt-base sputtering target contains Co as the principal component, Pt as an indispensable element, and at least one element selected from the group consisting of the 4a group elements, 5a group elements, 6a group elements, B and C, and the target has a structure in which the maximum inscribed circle diameter of a phase consisting of a Pt simple substance is substantially not more than 500 μm and in which the thickness of a diffusion layer at the boundary of the Pt phase is substantially not more than 50 μm. By using this target, it is possible to obtain a magnetic recording film which is used in a hard disk, etc., having a uniform Pt distribution in which the difference in the analytical value of the Pt content measured in the radial direction of the disk is not more than ±10%.

4 Claims, 6 Drawing Sheets

|—————|
100 μm

COPT-BASE SPUTTERING TARGET, METHOD OF MAKING SAME, MAGNETIC RECORDING FILM AND CO-PT-BASE MAGNETIC RECORDING MEDIUM

BACKGROUND OF THE INVENTION

The present invention relates to a sputtering target used in forming a CoPt-base alloy that is a recording layer of a magnetic recording medium, a method of making the sputtering target, and a CoPt-base magnetic recording medium.

In recent years, the amount of information processed on computers has been increasing with the development of an information-oriented society and it has become necessary to record and reproduce information at higher densities than before.

At present, in hard disks that are the external storage devices of personal computers, a multilayer structure in which an underlayer and a recording layer are formed on a substrate made of an Al alloy, glass, etc. is the mainstream.

In recent magnetic recording media, it is necessary to improve the coercivity and the squareness and to reduce noise for performing recording at higher densities than before, and CoCrPt-base alloys represented by CoCrTaPt are mainstream. In the CoCrTaPt, Pt which is effective in increasing the coercivity is added to conventionally used CoCr-base alloys.

The above recording layer is formed by the magnetron sputtering method through the use of an alloy target. When magnetron sputtering is performed through the use of a ferromagnetic target made of a Co alloy, the magnetic flux from magnets disposed at the bottom side of the target does not easily leak to the top surface of the target, causing plasmas to occur locally and the target to be partially consumed. For this reason, the problem of, for example, shorter target life arises. For improving this problem, reducing the magnetic permeability of materials for targets is effective, and various methods have been proposed.

For example, JP-A-2-49384 discloses a method for raising the target life by the improvement of magnetic properties, which improvement is achieved by applying strains to the interior of a Co alloy through cold working to thereby change the crystal structure of the alloy. JP-A-8-25270 discloses a method of reducing the magnetic permeability of a Co-base alloy target, which reducing is achieved by heat treatment performed after rolling etc. so that the crystal structure may be changed while precipitating intermetallic compound phases at grain boundaries.

Further, there is another problem that pass through magnetic flux is disturbed due to a nonuniform structure of the target, making the magnetic properties of the film nonuniform. Especially in the case of alloys containing large amounts of elements with different atomic weights represented by a CoCrPtTa alloy target, casting segregation is apt to occur during the melting and casting steps, and besides plastic workability becomes worse due to the occurrence of intermetallic compounds, making it difficult to obtain a uniform structure. For this reason, various methods as, stated below have been proposed.

JP-A-5-86456 discloses a method that comprises the steps of packing an ingot formed by melting and casting, performing HIP (hot isostatic pressing) after the heat treatment of the ingot and then performing rolling. JP-A-5-247638 discloses that it is possible to obtain a uniform structure and to lower magnetic permeability by the steps of melting and casting an alloy containing Co as the main component, 5 to 20 atomic % Cr, 10 to 55 atomic % Pt, 1 to 15 atomic % in total of both Ni and Ta, and 10 to 1500 ppm rare earth metals, forging, hot rolling and cold rolling.

Further, JP-A-5-247641 discloses a method of making the structure of a target uniform by sintering alloy powder containing Co as the main component, 4 to 18 atomic % Cr etc., 0.5 to 16 atomic % Pt, 0.1 to 8 atomic % Nb, and Ta etc.

As mentioned above, most of the improvements hitherto made on Co-base alloy targets aimed at reducing magnetic permeability and making the structure of a target uniform in order to improve the target use efficiency.

Furthermore, JP-A-4-297572 proposed by the present applicant discloses dispersing Pt particles in a sintered structure in order to increase the toughness of materials for targets. This technique can improve brittleness in a case where Pt is completely alloyed.

The present inventors are mainly engaged in the research and development of targets for sputtering devices of a stationary, opposing type. In this type, films are formed by means of a circular substrate disposed in a position opposed to a circular cathode, which is a typical structure of magnetic disk manufacturing device.

In this research and development, during the evaluation of the magnetic properties of films formed by means of CoPt-base alloy targets fabricated by the present inventors by a melting and casting process or a powder sintering process, the inventors faced a new problem that the coercivity of films changes continuously in the radial direction of the substrate. This is a major problem that causes a serious influence on the recording and reproducing characteristics of magnetic disks.

SUMMARY OF THE INVENTION

The present invention was made in view of the foregoing problem and an object of the present invention is to provide a CoPt-base sputtering target capable of obtaining a magnetic recording medium having a recording layer with uniform film characteristics and excellent recording and reproducing characteristics, a method of making the sputtering target, and a magnetic recording film formed by means of this sputtering target, and a CoPt-base magnetic recording medium in which this recording film is used.

As a result of elaborate examination of the above problem, the present inventors have found out that the chemical composition of a film changes continuously in the radial direction of substrate, that the amount of Pt in the film increases relatively with increasing distance from the erosion portion of the target, and that the change in the coercivity of the above film corresponds to the change in the amount of Pt in the film. In some specifications of the cathode of a sputtering device, inversely, the amount of Pt in the film decreases in the peripheral part of the substrate and it becomes also evident that the tendency of the change in the chemical composition of film differs from one sputtering device to another.

The present inventors made further elaborate examination of the structure of a target and the change in the film characteristics. As a result, they have found out that the variation of element distribution of the above film obtained with a target composed of an alloy phase occur due to a nonuniform distribution of elements which are sputtered from the alloy phase. Furthermore, the present inventors have found out that the element distribution of a film can be made uniform irrespective of the specifications of the cathode of a sputtering device by ensuring that a target has a structure in which the elements of the target are as little alloyed as possible and in which the elements are dispersed.

Finally, the present inventors have reached the present invention by finding out that in the case of a target made of a CoPt-base alloy containing elements other than Co and Pt, when at least Pt phase among the elements composing the target is finely dispersed while the thickness of a diffusion layer present at the boundary between the Pt phase and another phase is limited to be less than a predetermined value, it is possible to reduce the magnetic permeability of the material for the target and thereby to raise the use efficiency of the target while making uniform the Pt content within the film plane which Pt content has an especially great influence on the coercivity of the film.

The present invention provides a CoPt-base sputtering target containing Co as the main component, Pt as an indispensable element, and at least one kind selected from the group consisting of the 4a group elements, 5a group elements, 6a group elements, B and C. In the structure of this sputtering target, the diameter of a maximum inscribed circle of a phase consisting essentially of a Pt simple substance is substantially not more than 500 $\mu$m, and the thickness of a diffusion layer at the boundary of the Pt phase is substantially not more than 50 $\mu$m.

The target of the present invention may have a structure in which the elements composing the target are bonded to each other as a simple-substance phase.

Furthermore, the target of the present invention may have a structure in which a part of or all of Co is bonded as an alloy phase with at least a part of the elements other than Pt.

The present invention may be applied, for example, to a chemical composition consisting essentially of 0.1 to 25 atomic % Cr, 0.1 to 20 atomic % Pt, 0.1 to 15 atomic % Ta, and the balance Co and incidental impurities.

The above target of the present invention can be obtained by the steps of weighing and mixing Pt powder and other element powder selected from the group consisting of Co, 4a group elements, 5a group elements, 6a group elements, B and C, and sintering a resultant mixed powders at a temperature of 400 to 1000° C. In this case, simple substance powder or alloy powder or their mixture can be used as the other element powder.

Magnetic recording films can be produced by sputtering the target of the present invention. Such magnetic recording films have a uniform Pt distribution in which a difference in the analytical value of Pt content measured in the radial direction of a disk is not more than ±10%.

Magnetic recording media such as hard disks can be obtained by using these thin films.

DETAILED DESCRIPTION OF THE PREFERRED EMBODIMENTS

As mentioned above, an important feature of the present invention resides in the respect that at least Pt among the elements constituting the target is finely dispersed and, at the same time, the thickness of a diffusion layer at the boundary between the Pt phase and another phase is limited to be less than a predetermined value.

Specifically, the structure of the target is limited so that the maximum inscribed circle diameter of a phase consisting essentially of a Pt simple substance may be substantially not more than 500 $\mu$m and so that the thickness of a diffusion layer at the boundary of the Pt phase may be substantially not more than 50 $\mu$m.

The reason why the substantially maximum inscribed circle diameter of the Pt phase is limited to be not more than 500 $\mu$m is that if the maximum inscribed circle diameter exceeds this value, a change in the morphology of target surface becomes large as sputtering proceeds and the amount of variation of a film composition relative to a sputtering period of time increases.

The reason why the thickness of the diffusion layer formed at the boundary of the Pt phase is limited to be substantially not more than 50 $\mu$m in thickness is that if diffusion proceeds more, the element distribution of the film becomes large.

Thus, by providing the structure in which the Pt phase is dispersed without being alloyed, it becomes possible to make uniform the amount of Pt in the film, which has a great influence on the coercivity of the film throughout the substrate.

Although the reason for this is unknown, it may be supposed that in sputtering, the energy which is given to the atoms on the target surface by incident ions colliding against the target surface is transmitted to adjacent atoms on the target surface, with the result that the atoms are sprung out as sputtering particles.

It is assumed that in an alloy target comprising elements with atomic weights similar to each other, the energy of incident ions is uniformly transmitted to the elements constituting the target when the incident ions collide with the atoms on the target surface, causing no substantial deviation regarding element distribution in the film, whereas in an alloy target composed of elements with a great difference in atomic weight, the momentum and energy given and received in the collision differ one by one in dependence on atomic weight of individual atoms, causing directivity in ejection angle in some elements.

As a consequence, it is presumed that the amount of deposited atoms differs from one position of a film to another, making the composition of the film nonuniform. Especially, the atomic weight of Co is 58.9332, whereas that of Pt is 195.09 which is about three times as large as the former. From the above presumption, it is thought that these alloy phases are apt to cause the directivity of sputtering particles and that it is desirable to minimize the proportion of an alloy phase in the structure of the target in order to make uniform the amounts of elements in the film.

Particularly, in the case of a CoPt-base alloy film, Pt has the function of greatly increasing the crystalline magnetic anisotropy of Co and, therefore, it is thought that the nonuniformity of Pt element distribution has greater influence on the uniformity of magnetic properties of magnetic disks than that of other elements In view of the foregoing it is thought that it is desirable to reduce an alloy phase, which causes the nonuniform element distribution of film, as little as possible.

Therefore, in order to suppress the nonuniform element distribution as little as possible, it is preferable that a target has a structure in which the elements constituting the target are bonded to each other as simple-substance phases.

On the other hand, in the case of a target containing Co which is a ferromagnet, a structure in which all Co exists as a simple substance has greater magnetization than another structure in which Co is alloyed with other elements, and maximum magnetic permeability also increases, with the result that there occurs such a problem as pass through magnetic flux decreases and target life becomes short when this target is used in magnetron sputtering.

According to an examination by the present inventors, in the case of elements with relatively similar atomic weights, the nonuniform element distribution of film is not apt to occur even with an alloy phase. Especially in the case of a ferromagnetic alloy target, when a part of the elements constituting a target are alloyed, the magnetic permeability of the target decreases and it is possible to substantially improve use efficiency while maintaining the uniformity of the element distribution of film.

For example, in the case of a Co—Cr—Ta—Pt alloy target, since the atomic weight of Cr (51.996) is close to that of Co (58.9332), the nonuniform element distribution of film is not apt to occur even when a Co—Cr alloy phase is present in the structure of the target. In this case, by dispersing all or a part of the content while being alloyed with Co, it becomes possible to reduce the magnetization of the target, to increase pass through magnetic flux and to improve use efficiency.

In order to suppress the nonuniform distribution of Pt and to increase the pass through magnetic flux of a target, it is desirable that the target has a structure in which a part of or all of Co is bonded as an alloy phase alloyed with at least a part of the elements other than Pt.

It is preferable that the target of the present invention has a composition containing Co as the main component, Pt as an indispensable element, and at least one kind selected from the group consisting of the 4a group elements, 5a group elements, 6a group elements, B and C. Particularly, it is preferable that a Cr content is 0.1 to 25 atomic %, a Pt content being 0.1 to 20 atomic %, and a Ta content is 0.1 to 15 atomic %.

The reason for the limited chemical composition is described below.

As mentioned above, Pt has the functions of increasing the crystalline magnetic anisotropy of Co and of increasing coercivity. Therefore, Pt is an element indispensable for improving recording density.

The 4a group elements, 5a group elements, 6a group elements, B and C are effective for making the crystal grains fine in grain size and for improving segregation structure and crystal orientation with respect to films, and are elements effective for improving the magnetic properties of a recording layer.

The amounts of these elements to be added depend on the performance required in a magnetic recording medium, that is, depend on coercivity and magnetic flux density. It is desirable that the amounts of these elements to be added be not more than 50 atomic % in total because it is necessary to keep a considerable amount of Co that ensures basic magnetic properties.

It is especially preferred that an alloy contains 0.1 to 25 atomic % Cr, 0.1 to 20 atomic % Pt, 0.1 to 15 atomic % Ta, and an optional element of 0.1 to 15 atomic % B, because the alloy makes it possible to obtain high recording and reproducing characteristics as the recording layer of a magnetic disk.

Furthermore, it is preferable that the concentration of oxygen contained in a target is not more than 1500 ppm and more preferably not more than 800 ppm, because it reduces the magnetic properties of the film.

The feature of the method of making the target of the present invention resides in adopting a powder sintering process and limiting the sintering temperature to the range of 400 to 1000° C. The reason for the limited sintering temperature range is that at sintering temperatures of not more than 400° C., vacancies remain due to insufficient diffusion, causing abnormal electric discharges, whereas at sintering temperatures exceeding 1000° C., the alloy phase ratio increases due to the diffusion at the boundaries between powders, causing the nonuniform element distribution of the film. It is preferred to set the sintering temperature to a lower limit at which target densities of not less than 90% of a theoretical density are obtained.

Incidentally, raw material powder in any form can be used. In the production of alloy powder, however, it is preferred to adopt a gas atomization process using a small gaseous portion.

Particularly, it is preferred to perform during the sintering such sintering under pressure as HIP (hot isostatic pressing), hot pressing or hot extrusion, because a sintered body with a high density can be obtained even when the sintering is performed at a low temperature.

By using the target of the present invention, it is possible to obtain a novel magnetic recording medium with a reduced nonuniform element distribution on the recording layer of a magnetic recording medium, for example, a hard disk. Specifically, it is possible to obtain a CoPt-base magnetic recording medium in which the difference in the measured value of Pt content measured in the radial direction of a disk is not more than ±10% and the magnetic properties are uniform in the radial direction.

EXAMPLES

The present invention will be described below by referring to examples.

Production of Materials for Targets

The various powders of simple-substance elements including Pt powder of simple substance and Co-base alloy powders shown in Table 1 were prepared. For each of the Co-base alloy powders, a 25-kg master ingot made by melting and casting was gas-atomized in an atmosphere of nitrogen gas, and classification to not more than 60 meshes was then performed. Next, each of these powders was weighed to obtain the blend compositions shown in Table 2 and mixed for 30 minutes by means of a rocking mixer. These mixed powders were charged into an HIP can. The HIP can was evacuated to a pressure of not more than $10^{-1}$ Pa by means of an oil diffusion pump while heating the interior of the HIP can at a temperature of not less than 400° C., and HIP treatment was then carried out after the evacuation and sealing.

TABLE 1

|  | Powder composition (at %) | Specification* |
|---|---|---|
| Powder of simple substance element | Co | 3N, -#48 |
|  | Pt | 4N, -#48 |
|  | B | 5N, -#325 |
|  | Cr | 4N, -#48 |
|  | Ta | 3N, -#48 |
|  | Zr | 3N, -#100 |
| Alloy powder | Co25Cr | 3N, -#60 |
|  | Co6Cr3Ta | 3N, -#60 |
|  | Co6Cr6Ta | 3N, -#60 |
|  | Co15Cr6Ta | 3N, -#60 |
|  | Co22.5Cr2.2Zr | 3N, -#60 |

*"N" denotes nine which represents purity.
"-#" denotes mesh-under which represents particle size.

HIP was performed under the HIP conditions of 950° C., 150 MPa and 1 hour holding. Sample No. 9 is a comparative example in which excessive diffusion occurred due to the HIP conditions of 1250° C., 127 MPa and 3 hours. Next, these materials for targets were machined to remove the HIP cans, and materials for targets with a size of 100 mm diameter×4 mm thickness and test pieces for examining microstructure were obtained. In Sample Nos. 10 and 11, raw materials weighed to obtain the intended compositions were alloyed by vacuum melting and cast into ingots. After that, sheet materials were obtained by hot rolling at 1150° C. through 3 passes in total with a working ratio per one pass of 10%. Materials for targets with a size of 100 mm diameter×4 mm thickness and test pieces for examining microstructure were obtained by machining these sheet materials.

Microstructure of Material for Targets

Figure 1:
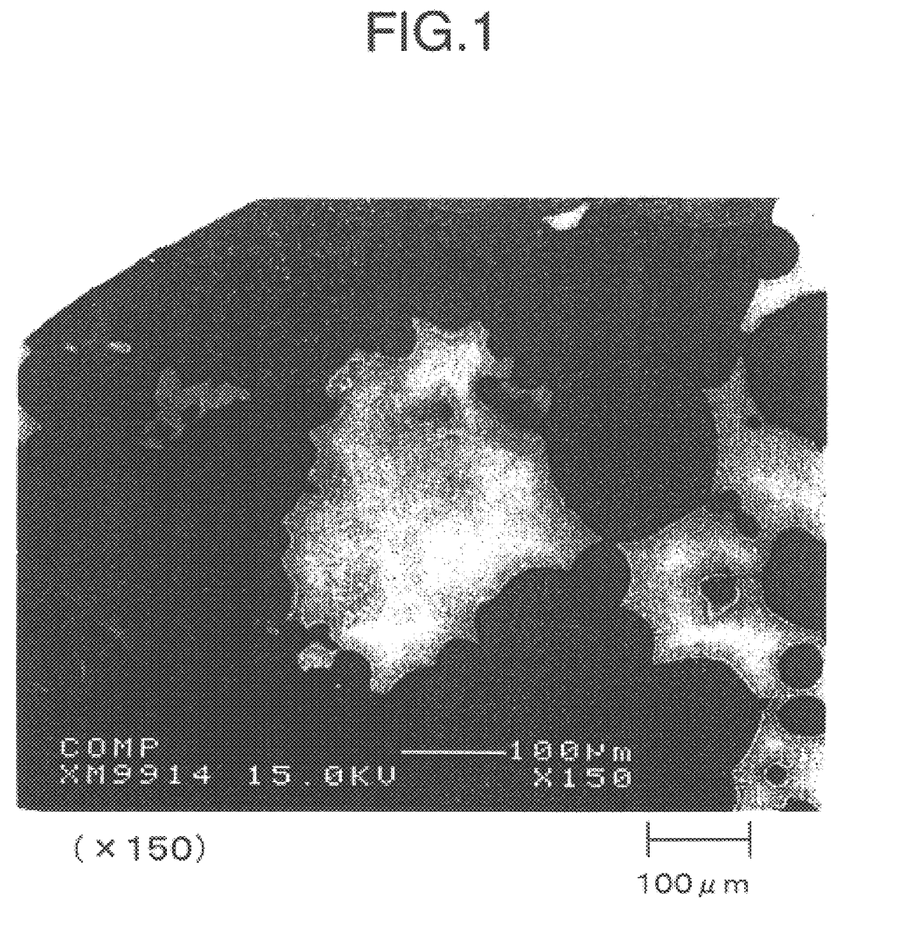
FIG. 1 is a photograph showing microstructure of Sample No. 3 embodying the present invention.

The microstructure of the target of the present invention is typically like the image of Sample No. 3 which image was obtained by use of an SEM (scanning electron microscope) of 150 magnifications, which image is shown in FIG. 1, and the phase composition of the sintered body of the target has ascertained to be substantially in a state in which the phases of the raw material powders are maintained. A diffusion state of Pt at the boundary of the Co alloy phase adjoining the Pt phase of this target was analyzed by means of JXA-8900, which is an EPMA analyzer produced by JEOL company, at an acceleration voltage of 15.0 kV, an irradiation current of 0.7 mA and measuring intervals of 1 μm. The result of this analysis is shown in FIG. 2.

Figure 2:
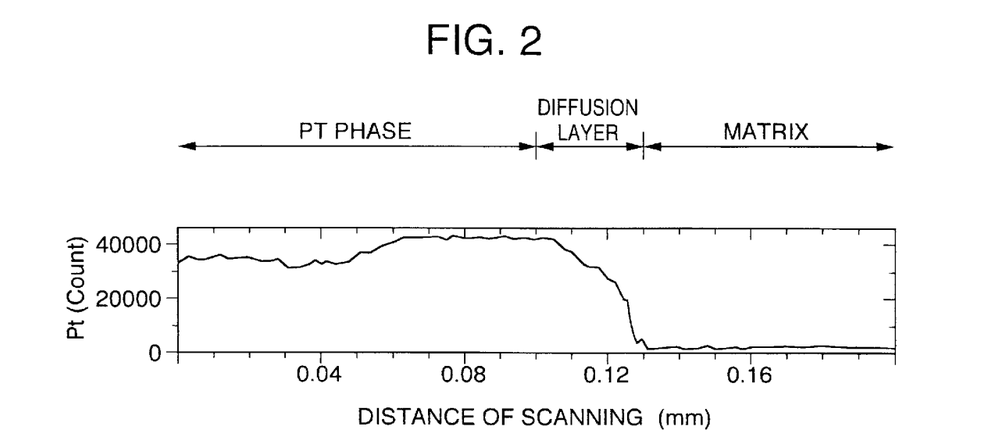
FIG. 2 is a graph showing a result of an EPMA line analysis regarding a boundary of Pt phase of Sample No. 3 embodying the present invention.

In FIG. 2, the detected count is plotted in the ordinate and the scanning distance in the abscissa. It has been ascertained from this figure that, although a diffusion layer with a thickness of about 30 μm maximum is formed, a Pt phase remains as substantially pure Pt except this diffusion portion.

The size of the phase consisting of the Pt simple substance was almost equal to the size of a powder particle of the Pt simple substance, and the maximum inscribed circle diameter was substantially not more than 30 μm.

Figure 3:
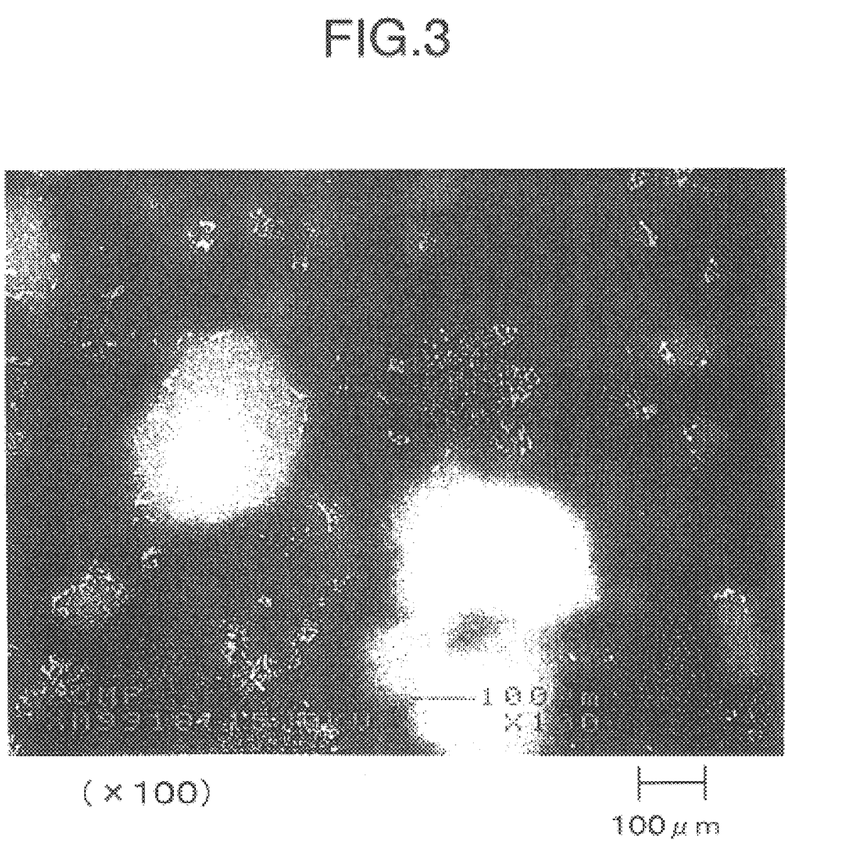
FIG. 3 is a photograph showing microstructure of Comparative Sample No. 9.
Figure 4:
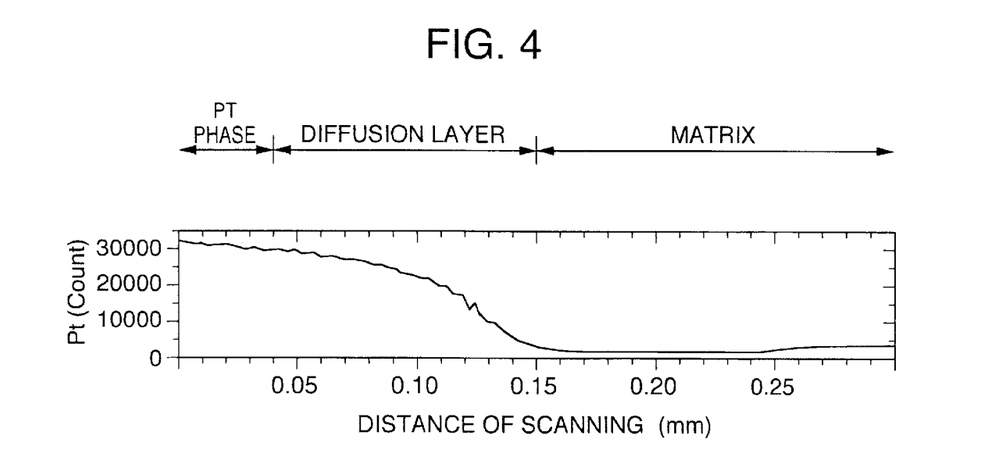
FIG. 4 is a graph showing a result of an EPMA line analysis regarding a boundary of Pt phase of comparative Sample No. 9.

On the other hand, the microstructure of the target of Comparative Sample No. 9 obtained at an elevated HIP temperature is like the image of FIG. 3 observed under an SEM (scanning electron microscope) of 150 magnifications, and it is found that diffusion proceeded more in comparison with the above example of present invention. The diffusion state of Pt at the boundary of the Co alloy phase adjoining the Pt phase was analyzed in the same manner as described above. The result of the analysis is shown in FIG. 4. It has been ascertained from this figure that a diffusion layer with a thickness of as large as about 100 μm is present.

The targets of Sample Nos. 10 and 11 in the comparative examples had a rolled structure composed of a complete alloy phase.

Further, in order to investigate the influence of a difference in diffusion state (which difference occurs due to a difference in the HIP temperature) on toughness, five pieces of 3-point bending transverse test samples with a span of 50 mm and a cross section of 5 mm×5 mm were prepared regarding each of the above Sample No. 2 of the present invention and Sample No. 9 in the comparative examples, a transverse test being conducted on these test pieces, and the average value of transverse rupture strength was measured. The transverse rupture strength of Sample No.2 of the present invention was 1620 N/mm$^2$ and that of Sample No. 9 of comparative example was 1870 N/mm$^2$.

In the present invention, by suppressing the diffusion layer thickness, toughness is slightly lowered in comparison with targets in which diffusion proceeded well. However, the target of the present invention has sufficient toughness as a target.

Magnetic Properties of Target

Test pieces with a size of 30 mm×10 mm×5 mm were prepared from the above targets, and maximum magnetic permeability was determined from magnetization curves measured by an electromagnet process. The result of this measurement is shown in Table 2. It is apparent from this table that when Sample Nos. 1, 2 and 3 are compared with each other which have the same composition in the examples of present invention, maximum magnetic permeability is lower in the targets of the present invention having a structure in which a part of the constitution elements are alloyed than in the targets having a structure consisting of simple-substance phases of the constitution elements.

TABLE 2

|  | Sample No. | Composition of target (at %) | Raw material powder | Condition of sintering | Maximum magnetic permeability |
|---|---|---|---|---|---|
| Samples of the Invention | 1 | Co15Cr4Ta4Pt | Co powder, Cr powder, Ta powder, Pt powder | 950° C. × 150 MPa × 1 h | 20.3 |
|  | 2 | Co15Cr4Ta4Pt | Co25Cr powder, Co powder, Ta powder, Pt powder | 950° C. × 150 MPa × 1 h | 12.4 |
|  | 3 | Co15Cr4Ta4Pt | Co15Cr6Ta powder, Co6Cr6Ta powder, | 950° C. × 150 MPa × 1 h | 5.6 |

TABLE 2-continued

| | Sample No. | Composition of target (at %) | Raw material powder | Condition of sintering | Maximum magnetic permeability |
|---|---|---|---|---|---|
| | 4 | Co20Cr6B9Pt | Co6Cr3Ta powder, Pt powder Co powder, Cr powder, B powder, Pt powder | 950° C. × 150 MPa × 1 h | 23 |
| | 5 | Co20Cr6B9Pt | Co25Cr powder, Co powder, B powder, Pt powder | 950° C. × 150 MPa × 1 h | 10 |
| | 6 | Co20Cr2Ta2Zr9Pt | Co powder, Cr powder, Ta powder, Zr powder, Pt powder | 950° C. × 150 MPa × 1 h | 24 |
| | 7 | Co20Cr2Ta2Zr9Pt | Co25Cr powder, Co powder, Ta powder, Zr powder, Pt powder | 950° C. × 150 MPa × 1 h | 13 |
| | 8 | Co20Cr2Ta2Zr9Pt | Co22.5Cr2.2Zr powder, Ta powder, Pt powder | 950° C. × 150 MPa × 1 h | — |
| Comparative samples | 9 | Co15Cr4Ta4Pt | Co15Cr6Ta powder, Co6Cr6Ta powder, Co6Cr3Ta powder, Pt powder | 1250° C. × 127 MPa × 3 h | 14 |
| | 10 | Co15Cr4Ta4Pt | — | Melting, casting and rolling | 17 |
| | 11 | Co20Cr2Ta2Zr9Pt | — | Melting, casting and rolling | — |

Element Distribution of Film

Figure 5:
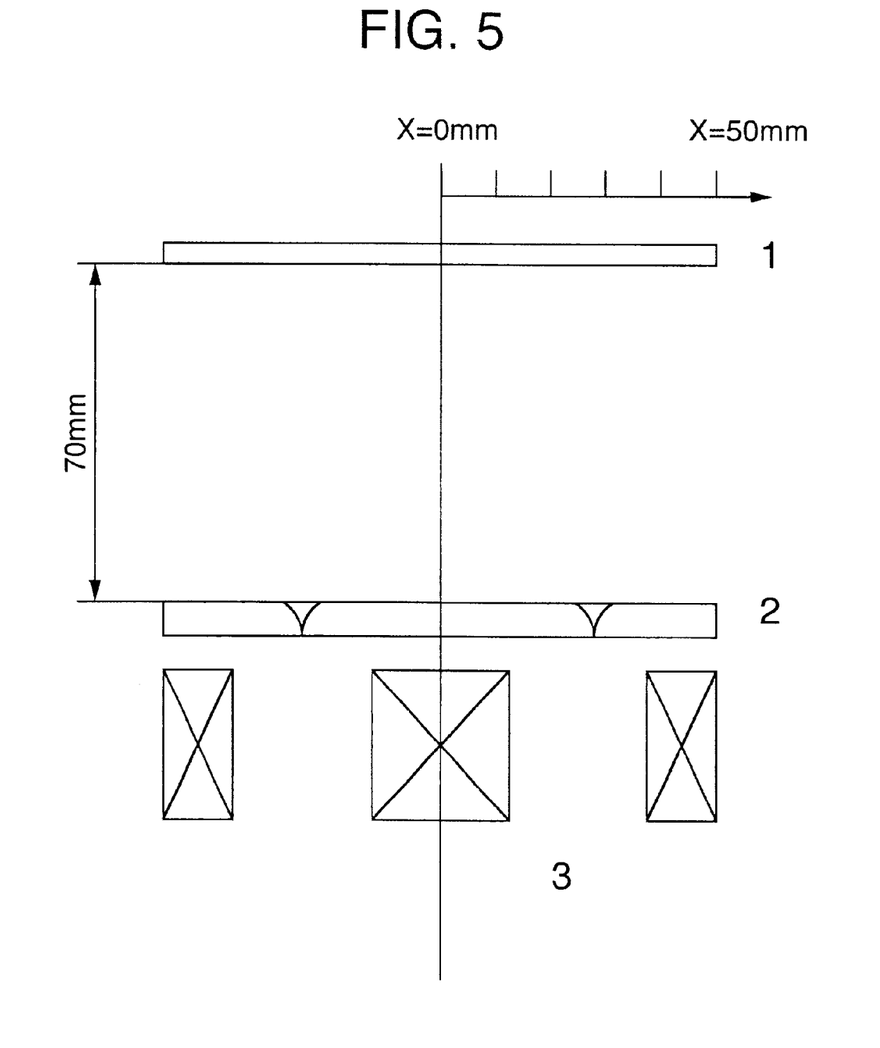
FIG. 5 is a drawing showing the arrangement of main portions of a device by which a film evaluation was performed.

The above targets of both the present invention and the comparative examples were mounted on a sputtering device provided with a substrate 1, a target 2 and a magnet 3. After evacuation to a pressure of not more than $10^{-4}$ Pa, high-purity Ar gas was introduced up to 0.3 Pa and a film with a thickness of 1 μm was formed on a slide glass by applying power of 500 W from a DC power supply. This slide glass was cut at intervals of 10 mm from the center of the substrate (X=0 mm) to the ends of the substrate (X=50 mm), and the composition of the film in each position was analyzed by an EPMA. Next, on the basis of the result of the analysis, the amount of deviation of the measured value of film composition in a position d mm (X=d) (atomic %) distant from the center of the substrate in comparison with the analytical value of film composition at the center of the substrate (X=0 mm) was evaluated regarding each element by the following equation:

Amount of deviation (%) = $100 \times \{C_A(X=d) - C_A(X=0)\} \div C_A(X=0)$

Figure 6:
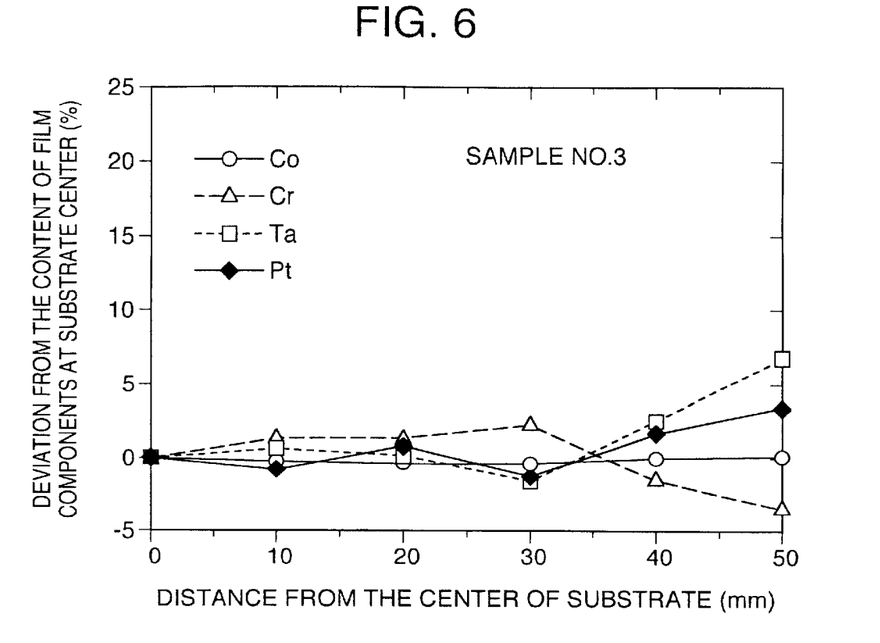
FIG. 6 is a graph showing the element distribution of the film of Sample No. 3 embodying the present invention.
Figure 7:
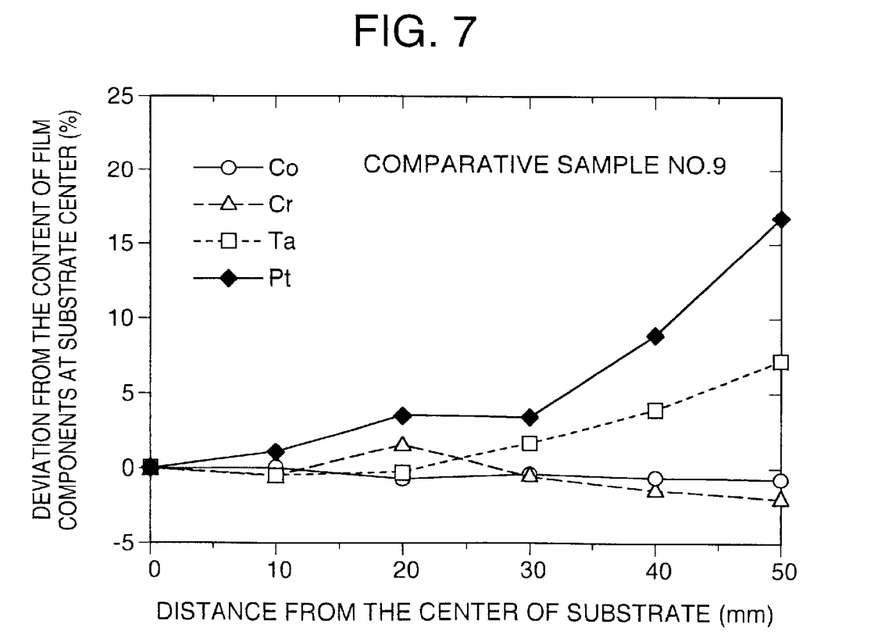
FIG. 7 is a graph showing the element distribution of the film of comparative Sample No. 9.
Figure 8:
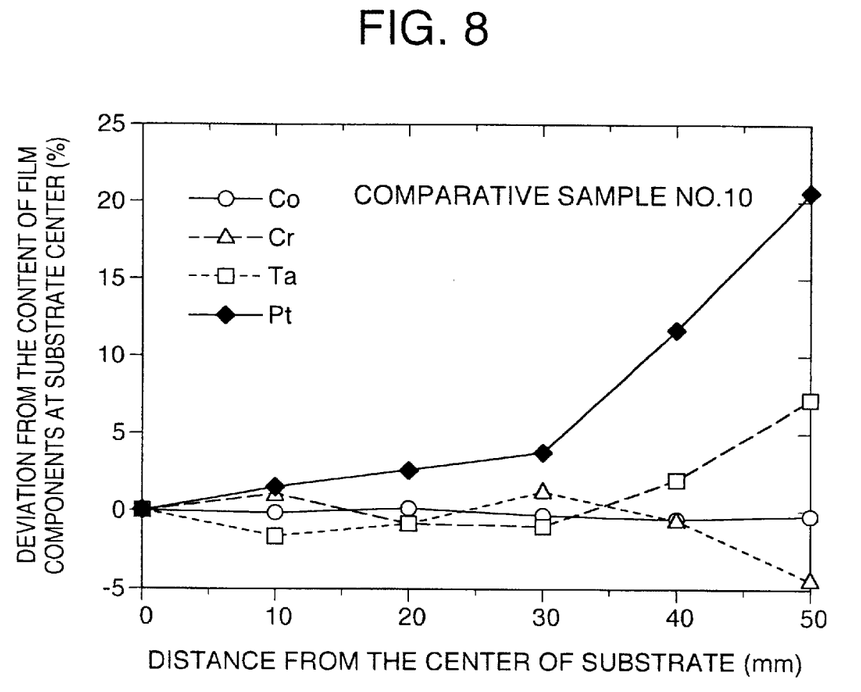
FIG. 8 is a graph showing the element distribution of the film of comparative Sample No. 10.

For each element of the film composition of the target of the present invention, a change in the amount of deviation in the radial direction of the substrate is typically like the result of Sample No. 3 shown in FIG. 6. In the targets of the comparative examples, this change is like the result of Sample Nos. 9 and 10 shown in FIGS. 7 and 8, respectively. It is found that the variation of the element distribution of the film formed by use of the target embodying the invention is made to be small in comparison with the films formed by use of the targets of comparative examples, and that in the film regarding the invention the change in the Pt content of film is very small especially in the area outward from the erosion portion (X=30 mm).

Although the non-uniform element distribution in the radial direction of substrate had posed a problem in magnetic recording media formed by use of CoPt-base targets made by conventional production methods, in the invention it becomes possible to make the variation of this element distribution remarkably smaller. Thus, the present invention provides a technique indispensable for improving the quality of magnetic recording media.

What is claimed is:

1. A CoPt sputtering target containing Co as the main component, Pt as an indispensable element in an amount of not less than 0.1 atomic %, and at least one element selected from the group consisting of the 4a group elements, 5a group elements, 6a group elements, B and C, said target being provided with a structure in which a maximum inscribed circle diameter of a dispersed phase consisting of a Pt simple substance is not more than 500 μm and in which a thickness of a diffusion layer at the boundary of the Pt phase is substantially not more than 50 μm.

2. A CoPt sputtering target according to claim 1, comprising a structure in which each of the elements constituting the target is bonded as a simple-substance phase.

3. A CoPt sputtering target according to claim 1, comprising a structure in which a part of or all of the Co is bonded as an alloy phase alloyed with at least a part of the elements other than Pt.

4. A CoPt sputtering target according to any one of claims 1 to 3, having a composition consisting essentially of 0.1 to 25 atomic % Cr, 0.1 to 20 atomic % Pt, 0.1 to 15 atomic % Ta, and the balance Co and incidental impurities.

* * * * *